United States Patent [19]

Takamura et al.

[11] Patent Number: 4,882,546

[45] Date of Patent: Nov. 21, 1989

[54] DEMODULATION CLOCK GENERATOR CIRCUIT

[75] Inventors: Yoshinobu Takamura, Tokyo; Norimichi Katsumura; Nebuhiko Osawa, both of Yamanashi; Kazuo Watanabe, Yamanashi, all of Japan

[73] Assignees: Pioneer Electronic Corporation, Tokyo; Pioneer Video Corporation, Yamanashi, both of Japan

[21] Appl. No.: 299,097

[22] Filed: Jan. 19, 1989

[30] Foreign Application Priority Data

Jun. 30, 1988 [JP] Japan ................................. 63-163425

[51] Int. Cl.[4] .............................................. H03D 3/00
[52] U.S. Cl. ........................................ 329/310; 375/87
[58] Field of Search .................. 329/50, 104, 110, 112, 329/122; 375/87, 94

[56] References Cited

U.S. PATENT DOCUMENTS 3,878,334  4/1975  Halpern ........................... 329/122 X
4,339,725  7/1982  Ichiyoshi ......................... 329/122 X Primary Examiner—Eugene R. LaRoche
Assistant Examiner—Robert J. Pascal
Attorney, Agent, or Firm—Sughrue, Mion, Zinn, Macpeak & Seas

[57] ABSTRACT

A demodulation clock generator circuit employed in a modulation system such as a bi-phase mark system is improved by including a frequency detector to speed up the initial processing of a data signal to be demodulated. The frequency detector generates a frequency detection signal which corresponds to a signal from an oscillator and a signal from a synchronization signal portion of the signal to be demodulated. The frequency detector includes a memory portion clocked by the oscillator for storing the states of the signal to be demodulated and a signal generating portion for supplying the frequency detection signal when information stored in the memory portion is the same as a synchronizing portion of the signal to be demodulated and has a frequency of less than a predetermined value.

3 Claims, 4 Drawing Sheets

DEMODULATION CLOCK GENERATOR CIRCUIT

BACKGROUND OF THE INVENTION

The present invention relates to a demodulation clock generator circuit. More particularly it relates to a demodulation clock generator circuit to be employed in a modulation system such as a bi-phase mark system in which a so-called self clock is enabled.

A demodulation clock generator has been employed in various fields of modern electronics, especially for electronics utilizing digital technology. One example of a data signal to be demodulated is shown in FIG. 4, namely, a digital audio interface signal modulated by a bi-phase mark modulation system. One sub-frame consists of 32 time slots. Time slots 0 through 3 are used for a preamble portion whose waveform corresponds to a sub-frame synchronization pattern containing predetermined bit patterns. Time slots 4 through 31 are used for a data portion of digital audio signals which are modulated by a bi-phase mark modulation system. Each time slot corresponds to symbols containing two continuous binary digits. In the data portion, the state of the first symbol of each time slot is always different from the state of the second symbol of the time slot immediately preceding that slot. The state of the second symbol of each time slot is the same as the state of the first symbol of the same slot when the value of the data bit corresponding to the time slot is "0", and the state of the second symbol of each time slot is different from that of the first symbol when the value of the data bit corresponding to the time slot is "1".

In FIGS. 5A to 5C, three different samples of synchronization patterns of the preamble portion of sub-frame contain bit patterns which do not appear in the data portion of the sub-frame.

Digital audio interface data signals modulated by the bi-phase mark modulation system contain signal components whose frequencies are equal to one time slot and whose frequencies are equal to one half of one time slot.

Hereinafter, one example of a circuit for a demodulation clock generator in the prior art technology for digital audio interface data signals which are modulated by a bi-phase mark system will be explained according to the illustration shown in FIG. 6. In the Figure, data signals to be demodulated are supplied to a demodulator 1 and a reference pulse generator 2. Reference pulse generator 2 creates two pulses by differential operation of the data signal to be demodulated. One of these pulses is synchronized to the leading edge of the data signal to be demodulated and the other is synchronized to the trailing edge of the data signal. One of these pulses is selected and its period is made longer than a predetermined value, and is output as a reference. The reference pulse generator 2 can be constructed, for example, using the following devices:

(a) a differential circuit by which two series of pulses as shown in FIG. 7 at (B) and (C) are generated synchronous with the leading edge and the trailing edge, respectively, of the data signal to be demodulated as shown in FIG. 7 at (A);

(b) a monostable multivibrator which is triggered at the trailing edge of the series of pulses and which produces an output pulse having a duration of a little less than one time slot;

(c) a gate circuit which outputs the pulse signal of the series of pulses only when the output pulse of the monostable multivibrator is present, thereby to produce a reference signal as shown in FIG. 7 at (D).

The reference signal output from reference pulse generator 2 is supplied to a phase locked loop (PLL) circuit 3. In PLL circuit 3, the reference signal is applied to a phase comparator 4 for comparing the phase with an output signal from a frequency divider 5. In the phase comparator, a signal corresponding to the phase difference between the reference signal and the output signal from the frequency divider 5 is output. This phase difference signal is supplied to a voltage-controlled oscillator (hereinafter referred to as VCO) 7 as an input voltage after passing through a low pass filter (hereinafter referred to as LPF) 6. The output signal from VCO 7 is supplied to frequency divider 5 to be divided by a ratio of, for example, one-sixth. The output signal from frequency divider 5 is simultaneously supplied to phase comparator 4 and to demodulator 1 as a clock signal for demodulation. Thus, the demodulation of the modulated signal is attained.

In the above-described example of a demodulation clock generator, the frequency of the signal supplied from reference pulse generator 2 is not always fixed to a determined value. Therefore, it takes a long time to set up the overall circuit after the data signal to be demodulated has first been supplied. This process will be explained further with the illustration of FIG. 8. In FIG. 8, the horizontal axis represents time and the vertical axis represents the oscillating frequency of VCO 7.

VCO 7 oscillates at a predetermined self-oscillation frequency $f_4$. The bits of the data signal to be demodulated are all "0" at time $t_1$ and the component of the signal having a frequency corresponding to a period of two time slots becomes larger. Due to this change, the demodulation clock signal output from frequency divider 5 becomes synchronized with the frequency corresponding to a period of one-half of a time slot and the frequency of VCO 7 becomes one-half of the predetermined frequency ($f_0/2$) at time $t_2$. When a data signal consists of "0" and "1" at time $t_3$, the level of the signal component having a frequency corresponding to a period of a full time slot of the data signal to be demodulated becomes higher and the frequency of the output signal from VCO 7 is correctly adjusted to the same value as the predetermined value ($f_0$) at time $t_4$. Thus, the process of setting up the overall circuit has been completed.

As described above, in a circuit for producing a demodulation clock signal using the prior art technique, the set-up process is not completed until the data input bits consist of "0" and "1". Because of this fact, a correct demodulating process cannot be attained correctly for a long period of time after the data signal to be demodulated has been supplied.

SUMMARY OF THE INVENTION

The present invention overcomes the difficulty set forth above. An object of the present invention is to provide a circuit for a demodulation clock generator realizing a short set-up time after data signals to be demodulated are supplied.

This object is accomplished in accordance with one aspect of the present invention by a circuit for maturing a demodulation clock signal comprising:

(a) a signal generator for supplying a reference signal synchronized with state transitions of the signal to be demodulated through modulation of a digital data signal and addition of a synchronized signal with a predetermined wave-form;

(b) an oscillator oscillating at a frequency corresponding to the magnitude of a control signal;

(c) a phase comparator for supplying a phase difference signal as the control signal to the oscillator based on the difference between the signal output from the oscillator and the reference signal;

(d) a frequency detector for generating a frequency detection signal corresponding to the frequency of the signal from the oscillator according to the distance between transitions in a synchronization signal portion of the signal to be demodulated; and (e) a frequency divider for changing the frequency of a signal from the oscillator which corresponds to the frequency detection signal.

The frequency detector can comprise:

(f) a plurality of memories for sequentially storing the states of the data signal to be demodulated and providing an output dependent upon the signal from the oscillator; and (g) a signal generator for supplying the frequency detection signal when information stored in the memories becomes the same as the preamble portion of the signal to be demodulated and which has a frequency of less than a predetermined value.

DETAILED DESCRIPTION OF THE PREFERRED EMBODIMENTS

The invention will now be described in further detail with reference to the accompanying drawings. However, the following examples are given merely to aid in the understanding of the present invention, and variations may be made by one skilled in the art without departing from the spirit and scope of the present invention.

Figure 1:
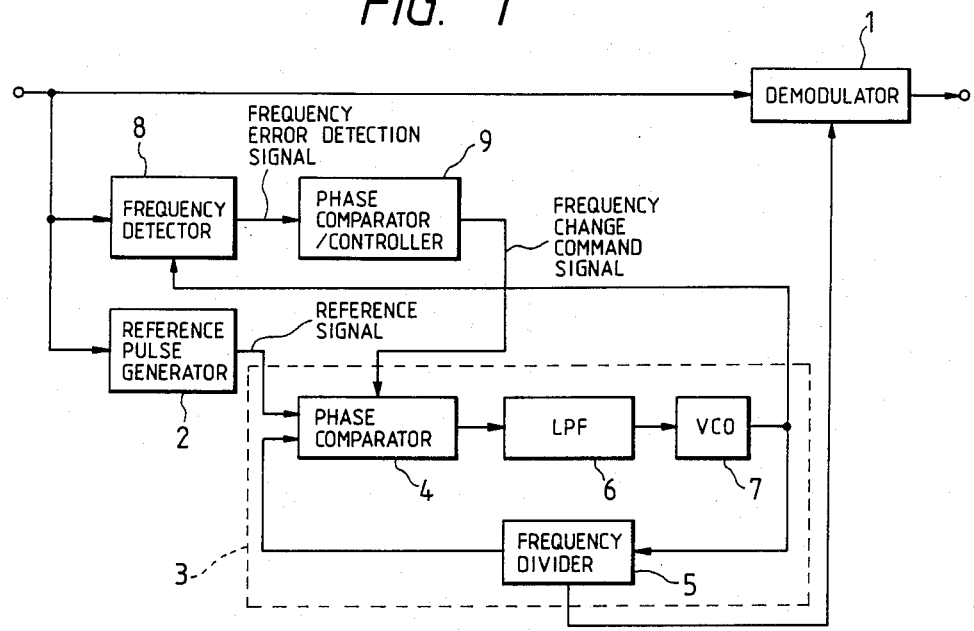
FIG. 1 is a block diagram of a demodulation clock generator which is an embodiment of the present invention.
Figure 6:
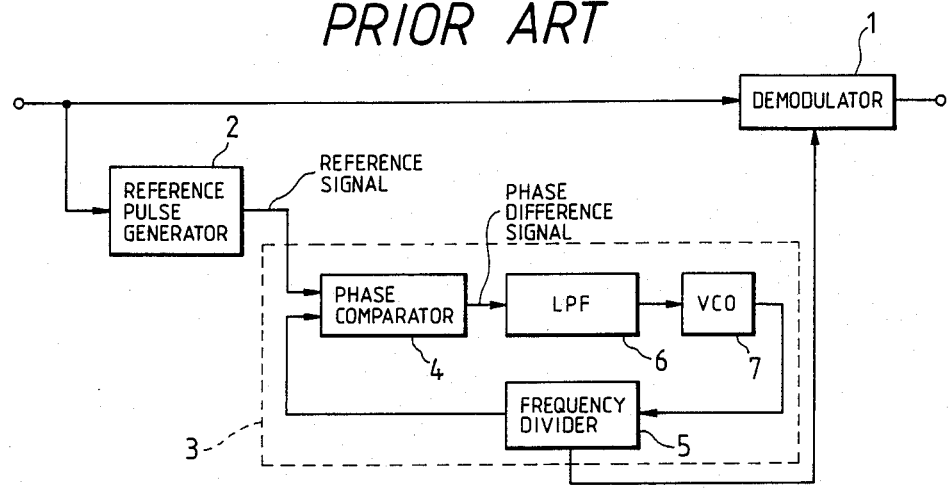
FIG. 6 is a block diagram showing a prior art demodulation clock generator.
Figure 7:
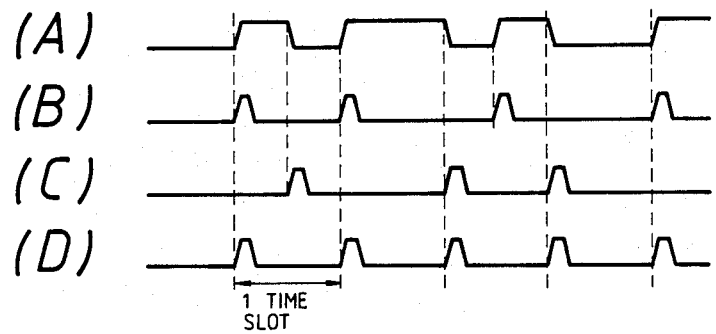
FIG. 7 illustrates sample wave-forms showing the operation of the reference pulse generator.
Figure 8:
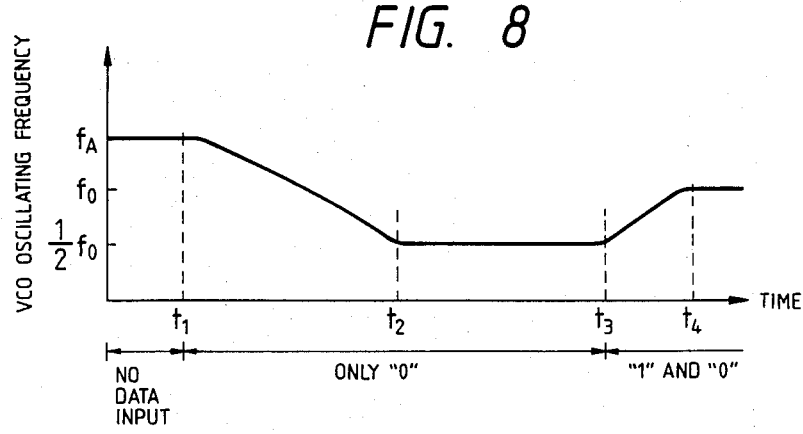
FIG. 8 is a timing diagram showing the operation of the circuit in FIG. 6.

FIG. 1 shows in block diagram form a demodulation signal generator constructed in accordance with the present invention. In this figure, demodulator 1, reference pulse generator 2 and PLL circuit 3 are connected together as they were in the prior art circuit of FIG. 6. However, in this example, the data signal to be demodulated is simultaneously supplied to demodulator 1, reference pulse generator 2, and to the frequency detector 8. An output signal from VCO 7 in PLL circuit 3 is supplied to frequency detector 8. Frequency detector 8 outputs a frequency error detection signal when the frequency of the signal supplied from VCO 7 becomes lower than a predetermined specific value. This is accomplished using the transition points of the preamble portion of the data signal to be demodulated as a synchronization signal. The output signal from the frequency detector 8 is supplied to phase comparator/controller 9 which outputs a command signal to change the frequency for a predetermined length of time corresponding to the frequency error detection signal. Phase comparator 4 generates a signal based on the phase difference between the reference pulse signal and the output signal from the frequency divider 5. Phase comparator 4 outputs the signal when the phase delay of the output signal from frequency divider 5 becomes a maximum value compared to that of the frequency change command signal from comparator/controller 9.

Figure 2:
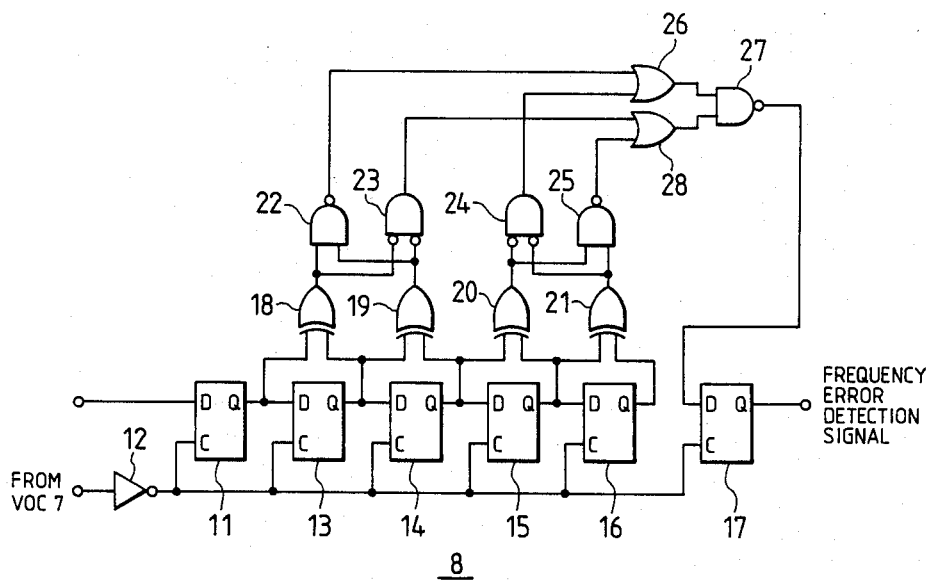
FIG. 2 is a circuit diagram illustrating a frequency detection circuit for the clock generator of the present invention.
Figure 3:
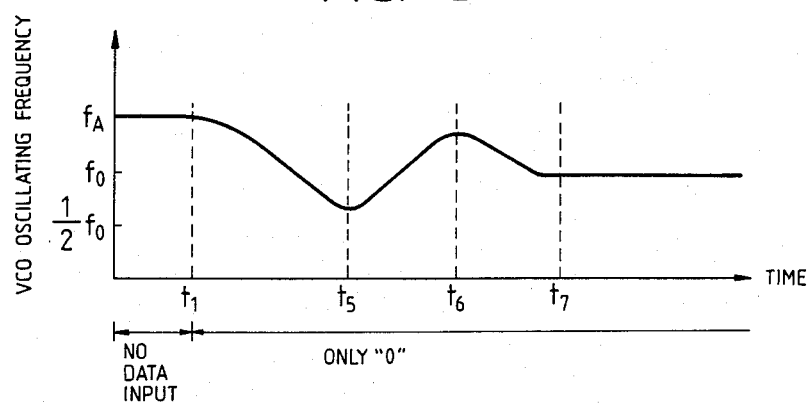
FIG. 3 is a timing diagram showing the operation of the circuit in FIG. 1.
Figure 4:
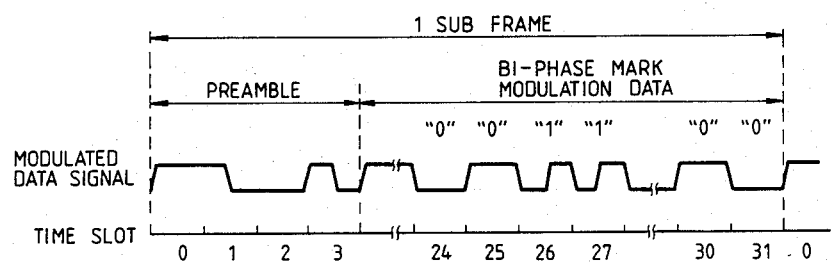
FIG. 4 illustrates sample wave-forms of digital audio interface signals modulated by a bi-phase mark system.

FIG. 2 is a circuit diagram illustrating frequency detection circuit 8. The data signal to be demodulated is supplied to the D input terminal of a D type flip-flop (hereinafter referred to as D-FF) 11. The output signal from VCO 7 is supplied to the clock terminals of D-FFs 11, 13, 14, 15, 16, and 17 through an inverter 12. The Q output of D-FF 11 is supplied to the D input terminal of D-FF 13 and at the same time to a first input terminal of an "Exclusive OR" gate (hereinafter referred to as EXOR) 18. The Q output from D-FF 13 is supplied to the D input terminal of D-FF 14, a second input terminal of EXOR 18 and a first input terminal of EXOR gate 19. The Q output from D-FF 14 is supplied to the D input terminal of D-FF 15, a second input terminal of EXOR gate 19 and a first input terminal of EXOR gate 20. The Q output from D-FF 15 is supplied to the D input terminal of D-FF 16, a second input terminal of EXOR gate 20 and a first input terminal of EXOR gate 21. The Q output from D-FF 16 is supplied to a second input terminal of EXOR gate 21.

The output from EXOR gate 18 is supplied to a first input terminal of a NAND gate 22 and a first input terminal of a NOR gate 23. The output signal from EXOR gate 19 is supplied to a second input terminal of NAND gate 22 and a second input terminal of NOR gate 23. The output signal from EXOR gate 20 is supplied to a first input terminal of a NOR gate 24 and a first input terminal of a NAND gate 25. The output signal from EXOR 21 is supplied to a second input terminal of NOR gate 24 and a second input terminal of NAND gate 25.

The output signals from NAND gate 22 and NOR gate 24 are supplied to the inputs of an OR gate 26 and then supplied to a first input terminal of a NAND gate 27. The output signals from NOR gate 23 and NAND gate 25 are input to an OR gate 28 and then output to a second input terminal of NAND gate 27. The output signal from NAND gate 27 is supplied to the D input terminal of D-FF 17. The output signal from the Q output terminal of D-FF 17 is output as a frequency error detection signal.

In the circuit described above, when the D input signal to D-FF 17 changes to "high", the D-FF is in the "set" state and the frequency error signal is output when the output signals from NAND gate 22 and NOR gate 24 are both "low", or when the output signals from NAND gate 25 and NOR gate 23 are both "low". For both output signals from NAND gate 22 and NOR gate 24 to become "low" at the same time, the states of D-FFs 11 and 13 must be different, the states of D-FFs 13 and 14 must be different, and the state of D-FF 15 must be different from either the state of D-FF 14 or the state of D-FF 16. For both output signals from NOR gate 23 and NAND gate 25 to become "low" at the same time, the states of D-FFs 14 and 15 must be different, the state of D-FFs 15 and 16 must be different, and the state of D-FF 13 must be different from either the state of D-FF 11 or the state of D-FF 14. To realize these specific states, for example, the data signal to be demodulated should change as follows:

(a) remain "high" for one-half of a time slot just after having been "low" for one time slot, or (b) remain "low" for one-half of a time slot just after having been "high" for one time slot.

Figure 5:
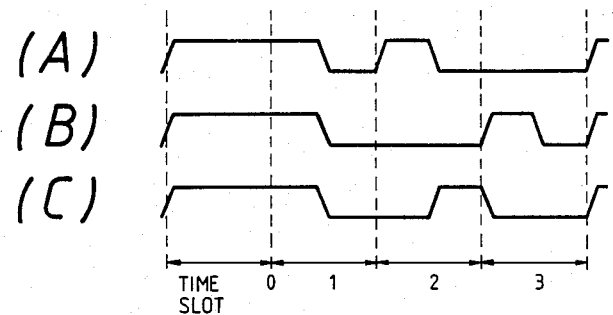
FIG. 5 shows samples of the sub-frame synchronization patterns.

The frequency of the output signal from VCO 7 should be less than one-half of the predetermined value. Herein, the possible synchronization patterns for the preamble portion are "B", "M", and "W" as shown in FIG. 5. Since a portion exists in which the signal pattern does not change for longer than one time slot before or after a pulse portion with a frequency of one-half of a time slot, when one of the signal patterns illustrated as "B", "M", or "W" is supplied and at the same time the frequency of the output signal from VCO 7 is less than one-half of the determined value, the frequency error signal is output. Hereby, a command signal corresponding to the frequency error detection signal is output from phase comparator/controller 9 in order to change the frequency for the predetermined time length. The same command signal as that supplied when the phase delay of the output signal from the frequency divider 5 is a maximum value is output. Thereafter, the oscillation frequency of VCO 7 is increased by the signal. The frequency error detection signal can be output when the frequency of the output signal from the VCO 7 is less than two-thirds of the predetermined synchronization frequency. Accordingly, at time $t_1$, when all of the bits of the data signal are "0", VCO 7 oscillates at its own oscillation frequency $f_4$. This is because as the component of the frequency signal having a frequency of one-half time slot becomes larger, the oscillation frequency of the VCO 7 tends to be one-half of the required frequency ($f_0/2$). Since the frequency error signal is output at time $t_5$, when one of the patterns "B", "M" and "W" of the preamble of the input signal to be demodulated is supplied, the command to change frequency is output for a predetermined time period to the phase comparator 4. The oscillation frequency of VCO 7 increases for the predetermined time period until time $t_6$. The oscillation frequency of VCO 7 is controlled so that the frequency and the phase of the output signal from frequency divider 5 become equal to those of a signal with a period of one time slot at time $t_7$. In the context of what is described above, since the required demodulation clock can be generated before the bits of the signal to be demodulated consist of "0" and "1", the object of the invention to generate the required demodulation clock with a short set-up time is realized.

As described above, a circuit for a demodulation clock generator according to in the present invention generates a frequency detection signal with the distance between the transition points of the preamble portion supplied as a synchronization signal for the data signal to be demodulated, and the frequency of the oscillator is changed according to the frequency detection signal. Since the demodulation signal can be generated with a required frequency independently of the data value of the signal to be demodulated, a short set-up time to generate the required demodulation clock is realized. As a frequency detection signal is output to the oscillator with the distance between the transition changing points of the preamble portion as a synchronization signal for the data signal to be demodulated, no reference clock signal is additionally required.

This circuit can be implemented using logic circuit modules, and stable operation is attained without drift of characteristics induced by temperature changes.

What is claimed is:

1. A demodulation clock generator circuit comprising:

signal generating means for supplying a reference signal synchronized with state transitions of a signal to be demodulated by modulating a digital data signal and adding a synchronized signal with a predetermined wave-form;

oscillating means oscillating at a frequency corresponding to a magnitude of a control signal;

comparison means for supplying a phase difference signal as said control signal to said oscillating means based on a difference between said reference signal and a signal output by said oscillating means;

frequency detection means for generating a frequency detection signal corresponding to the frequency of said signal output by said oscillating means according to the distance between state transitions in a synchronization signal portion of said signal to be demodulated; and frequency changing means for changing the frequency of said signal output by said oscillating means according to said frequency detection signal.

2. A demodulation clock generator circuit as claimed in claim 1, wherein said frequency detection means comprises:

storage means for sequentially storing state of said signal to be demodulated and providing an output dependent upon said signal output by said oscillating means; and signal generating means for supplying said frequency detection signal when information stored in said storage means becomes the same as a preamble portion of said signal to be demodulated and has a frequency of less than a predetermined value.

3. A demodulation clock generator circuit as claimed in claim 1, wherein a data portion of said signal to be demodulated is implemented using a bi-phase mark system.

* * * * *